US012593632B2

(12) United States Patent
Yang et al.

(10) Patent No.: US 12,593,632 B2
(45) Date of Patent: Mar. 31, 2026

(54) METHOD OF IMPLANTING SEMICONDUCTOR DONOR SUBSTRATE AND METHOD OF MANUFACTURING SEMICONDUCTOR-ON-INSULATOR STRUCTURE

(71) Applicant: Taiwan Semiconductor Manufacturing Company, Ltd., Hsinchu (TW)

(72) Inventors: Su-Chun Yang, Hsinchu County (TW); Jui Hsuan Tsai, Taipei City (TW); Jih-Churng Twu, Hsinchu County (TW); Chung-Shi Liu, Hsinchu City (TW); Chen-Hua Yu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 332 days.

(21) Appl. No.: 18/450,347

(22) Filed: Aug. 15, 2023

(65) Prior Publication Data

US 2025/0062127 A1     Feb. 20, 2025

(51) Int. Cl.
H01L 21/266 (2006.01)
H01L 21/762 (2006.01)

(52) U.S. Cl.
CPC ...... H01L 21/266 (2013.01); H01L 21/76254 (2013.01)

(58) Field of Classification Search
CPC ............. H01L 21/266; H01L 21/76254; H01L 21/2007; H01L 21/02521; H01L 21/02576; H01L 21/3226
See application file for complete search history.

(56) References Cited

U.S. PATENT DOCUMENTS

| | | | | |
|---|---|---|---|---|
| 5,659,184 | A * | 8/1997 | Tokunaga | ......... H01L 21/02639 257/79 |
| 6,197,697 | B1 * | 3/2001 | Simpson | ............. H01L 21/3043 216/87 |
| 7,229,899 | B2 * | 6/2007 | Moriceau | .......... H01L 21/26506 438/45 |
| 7,615,463 | B2 * | 11/2009 | Aspar | ............... H01L 21/76254 257/E21.568 |
| 2010/0216295 | A1 * | 8/2010 | Usenko | ............... H01L 21/2007 438/481 |
| 2011/0207306 | A1 * | 8/2011 | Cherekdjian | ..... H01L 21/76254 438/513 |
| 2019/0214294 | A1 * | 7/2019 | Peidous | ............ H01L 21/76254 |
| 2019/0378753 | A1 * | 12/2019 | Samanta | ........... H01L 21/76254 |

* cited by examiner

*Primary Examiner* — Mohsen Ahmadi
(74) *Attorney, Agent, or Firm* — JCIPRNET

(57) ABSTRACT

A method of a semiconductor-on-insulator structure includes the following steps. A semiconductor donor substrate is provided. A first implantation process is performed to form an exfoliation layer of the semiconductor donor substrate with a first ion concentration. A second implantation process is performed on a perimeter region of the exfoliation layer to form a high concentration region of the exfoliation layer with a second ion concentration higher than the first ion concentration. The semiconductor donor substrate is bonded to a semiconductor handle substrate, so that the exfoliation layer with the high concentration region is bonded to the semiconductor handle substrate. An annealing process is performed to separate the exfoliation layer from the rest of the semiconductor donor substrate.

16 Claims, 9 Drawing Sheets

100

112
132
130

100

112
132
130

R13     R13

122a     120a 112a
110

METHOD OF IMPLANTING SEMICONDUCTOR DONOR SUBSTRATE AND METHOD OF MANUFACTURING SEMICONDUCTOR-ON-INSULATOR STRUCTURE

BACKGROUND

In bulk semiconductor substrates, an active semiconductor region of a transistor may be disposed in a well region, where the well region is located within a bulk semiconductor region. In such structures, junction capacitance between the well region and the bulk semiconductor region may impact device performance. By contrast, some microelectronic devices place active semiconductor regions in an upper semiconductor layer of a semiconductor-on-insulator ("SOI") substrate. The upper semiconductor layer may be separated from a bulk semiconductor region of the substrate by an insulating layer such as a buried oxide ("BOX") layer. The insulating layer may improve device performance by eliminating junction capacitance between the upper semiconductor layer and the bulk semiconductor region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
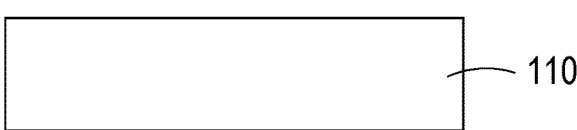
FIG. 1 to FIG. 11 illustrate schematic views of intermediate stages in the manufacturing of a semiconductor-on-insulator structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 11 illustrate schematic views of intermediate stages in the manufacturing of a semiconductor-on-insulator structure according to some exemplary embodiments of the present disclosure. FIG. 1 to FIG. 11 depict an example of a multi-step of implantation process used to form a semiconductor-on-insulator (SOI) structure, e.g., the SOI structure 100 shown in FIG. 11. The substrates for use in the present disclosure include a semiconductor handle substrate, e.g., a single crystal semiconductor handle wafer, and a semiconductor donor substrate, e.g., a single crystal semiconductor donor wafer. The semiconductor device layer in a semiconductor-on-insulator structure 100 is derived from the semiconductor donor wafer 110. The semiconductor device layer may be transferred onto the semiconductor handle substrate 130 by cleaving the semiconductor donor substrate 110 including a damage plane.

Figure 17:
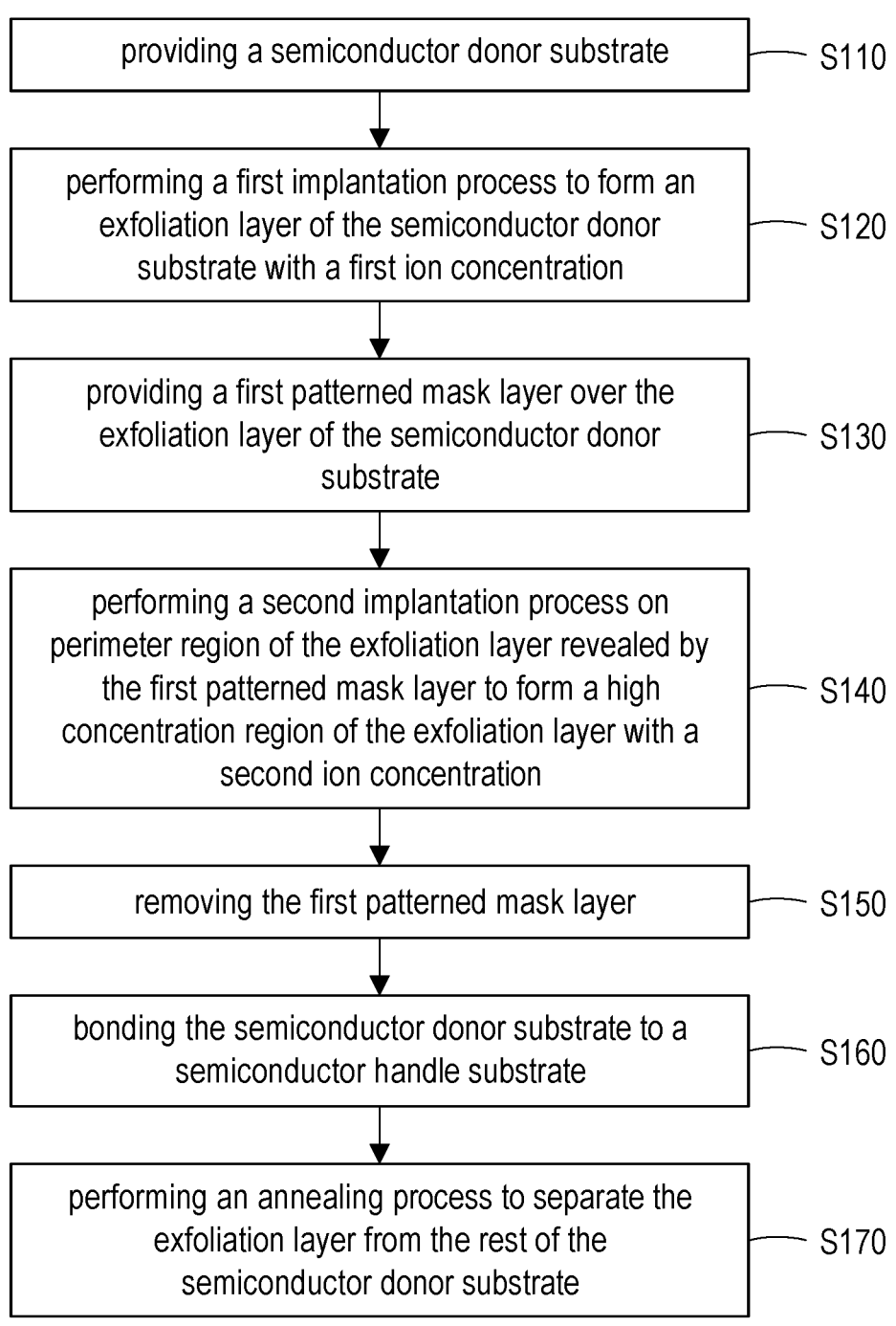
FIG. 17 illustrates a flow diagram of process steps for an intermediate stage in the manufacturing of a semiconductor-on-insulator structure according to some exemplary embodiments of the present disclosure.

FIG. 17 illustrates a flow diagram of process steps for an intermediate stage in the manufacturing of a semiconductor-on-insulator structure according to some exemplary embodiments of the present disclosure. Referring to FIG. 1 and FIG. 17, in some embodiments, at step S110, a semiconductor donor substrate 110 is provided. In one embodiment, the semiconductor donor substrate 110 may be single crystal semiconductor wafers. The semiconductor donor substrate 110 may include a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., single crystal silicon donor wafer 110, of the present disclosure typically have a nominal diameter of at least about 150 mm, at least about 200 mm, at least about 300 mm, or at least about 450 mm, but the disclosure is not limited thereto. The wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers, but the disclosure is not limited thereto. In one embodiment, the semiconductor donor substrate 110 have mirror-polished front surface finishes that are free from surface defects, such as scratches, large particles, etc.

In some embodiments, the semiconductor donor substrate 110 may include interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA.

Figure 2:
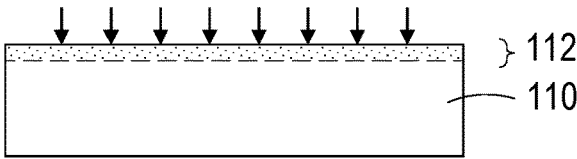

With now reference to FIG. 2, at step S120, a (first) implantation process is performed to form an exfoliation layer 112 of the semiconductor donor substrate 110 with a first ion concentration. The exfoliation layer 112 is created by subjecting a front surface of the semiconductor donor substrate 110 to one or more ion implantation processes to create a weakened region below the front surface of the semiconductor donor substrate 110. The exfoliation layer 112 includes a plurality of semiconductor devices and may be seen as the semiconductor device layer that is to be transferred onto the semiconductor handle substrate to form the SOI structure. Although the embodiments of the present disclosure are not limited to any particular method of forming the exfoliation layer 112, one suitable method dictates that the implantation surface of the semiconductor donor substrate 110 may be subject to a hydrogen ion implantation process to at least initiate the creation of the exfoliation layer 112 in the semiconductor donor substrate 110. That is, the implantation process includes a hydrogen ion implantation. For the embodiment of hydrogen ion implantation process, the exfoliation layer 112 has a first ion concentration ranges from about $4 \cdot 10^{16}$ to about $6 \cdot 10^{16}$. In other embodiments, the implantation process includes a helium ion implantation, or the like. For the embodiment of the helium ion implantation process, the exfoliation layer 112 has a first ion concentration ranges from about $1 \cdot 10^{16}$ atom/cm² to $3 \cdot 10^{16}$ atom/cm². The implantation process is followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the semiconductor donor substrate 110 at the specified depth at which they were implanted. The surface of the semiconductor donor substrate 110 is cleaned to remove organic compounds or other contaminants, such as boron compounds, deposited on the semiconductor donor substrate 110 during the implantation process.

The implantation energy may be adjusted to achieve an approximate thickness of the exfoliation layer 112. By way of example, hydrogen ion implantation may be employed, although other ions or multiples thereof may be employed, such as boron plus hydrogen, helium plus hydrogen, or other ions known in the literature for exfoliation. Again, any other known or hereinafter developed technique suitable for forming the exfoliation layer 112 may be employed without departing from the spirit and scope of the present disclosure. For example, single-beam ion implantation, plasma immersion ion implantation (PIII) and ion shower, involving the use of a single ion species or multiple ion species, may be used. In one embodiment, the exfoliation layer 112 may have a thickness of about 500 nm, but the exfoliation layer 122 may be made as thin as desired and/or as feasible.

Figure 3:
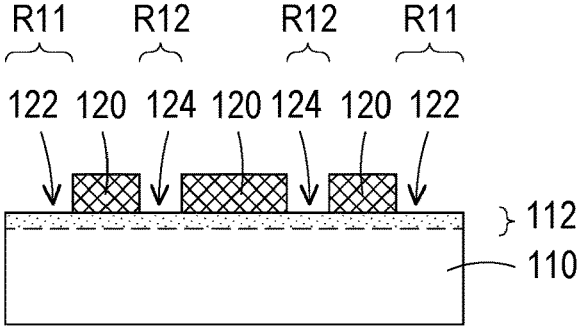
Figure 3A:
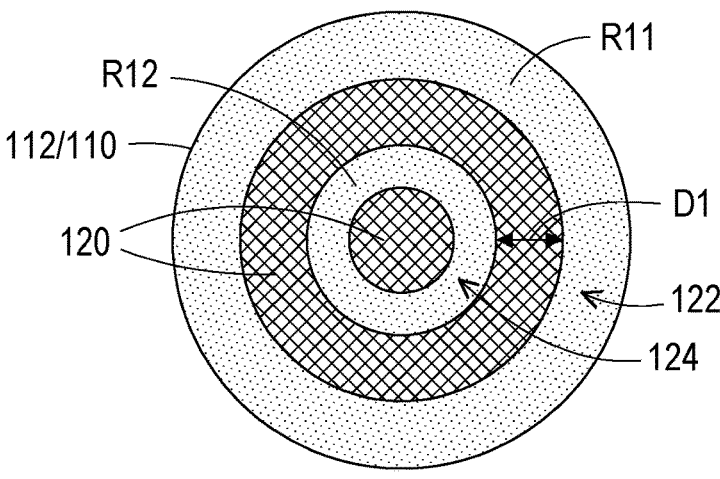

With now reference to FIG. 3 and FIG. 3A, in some embodiments, at step S130, a first patterned mask layer 120 is provided over the exfoliation layer 112 of the semiconductor donor substrate 110. The first patterned mask layer 120 at least reveals a perimeter region R11 of the exfoliation layer 112. In some embodiments, the first patterned mask layer 120 may be a photoresist layer, or the like. Generally speaking, a photoresist layer (or film) is spin-coated onto a substrate and is then exposed to a radiation. Subsequently, it is developed in a developer (a chemical solution), which removes portions (such as exposed portions in a positivetone photoresist or unexposed portions in a negative-tone photoresist) of the resist layer, thereby forming a mask pattern. The mask pattern may be used as an ion implantation mask in subsequent ion implantation processes applied to the underlying material layer.

In some embodiments, the first patterned mask layer 120 includes an outermost groove pattern 122 surrounding a perimeter of the exfoliation layer 112 to reveal the perimeter region R11 of the exfoliation layer 112 of the semiconductor donor substrate 110. In other words, the outer diameter of first patterned mask layer 120 is smaller than the outer diameter of the semiconductor donor substrate 110 to expose the perimeter region R11 of the exfoliation layer 112 of the semiconductor donor substrate 110. In some embodiments, the first patterned mask layer 120 further includes an inner groove pattern 124. The inner groove pattern 124 is located within a region surrounded by the outermost groove pattern 122 to reveal an inner region R12 of the exfoliation layer 112. In the present embodiment, the inner groove pattern 124 is arranged in concentric manner with respect to the outermost groove pattern 122 as shown in FIG. 3A. In one embodiment, a gap D1 between the outermost groove pattern 122 and the inner groove pattern 124 may range from about 100 μm to about 10 mm.

Figure 4:
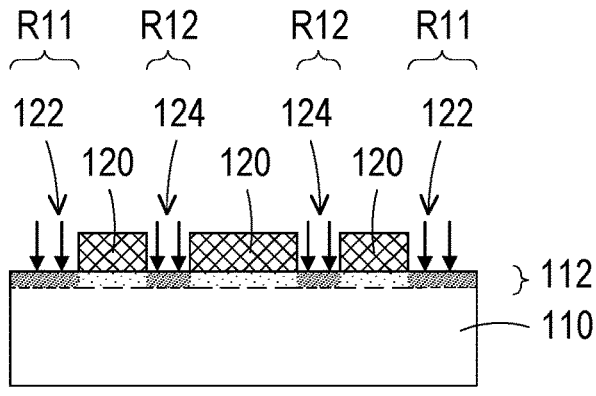

With now reference to FIG. 4, in some embodiments, at step S140, a second implantation process is at least performed on the perimeter region R11 of the exfoliation layer revealed by the outermost groove pattern 122 of the first patterned mask layer 120 to form a high concentration region R11 of the exfoliation layer 112 with a second ion concentration higher than the first ion concentration. In the present embodiments, the first patterned mask layer 120 includes the outermost groove pattern 122 and the inner groove pattern 124, so the second implantation process is performed on the perimeter region R11 and the inner region R12 of the exfoliation layer 112 to form a high concentration region R11 and R12 with higher ion concentration, and the rest of the exfoliation layer 112 can be called as low concentration region R2 with lower ion concentration. The high concentration region R11 and R12 of the exfoliation layer 112 is created by subjecting the regions exposed by the patterned mask layer 120 to more than one ion implantation processes to create a weakened region below the upper surface of the donor semiconductor wafer 110.

Figure 5:
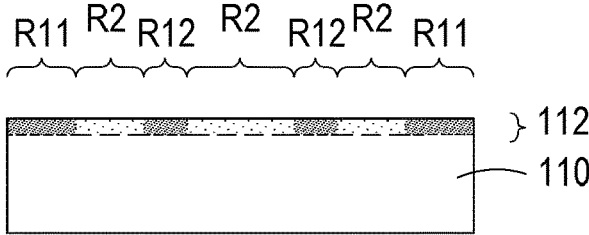
Figure 5A:
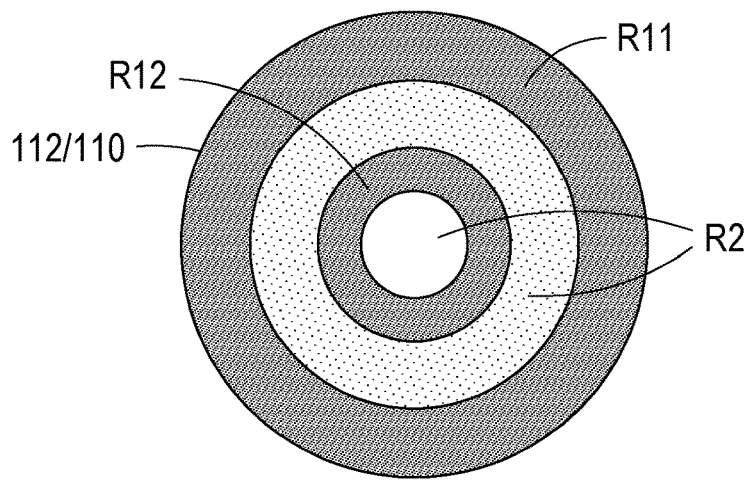

Then, referring to FIG. 5 to FIG. 5A, in some embodiments, at step S150, the first patterned mask layer 120 is removed, and the semiconductor donor substrate 110 with different ion concentrations is formed. The high concentration region R11 and R12 of the exfoliation layer is subjected to more than one implantation process, so the ion concentration thereof is higher than the rest portion of the exfoliation layer 112 that is covered by the patterned mask layer 120 during the second implantation process. In some embodiments, for the embodiment of the second implantation process being a hydrogen ion implantation process, the high concentration region R11 and R12 has a higher (second) ion concentration ranges from about $8 \cdot 10^{16}$ to about $1 \cdot 10^{17}$. In other embodiments, for the embodiment of the second implantation process being a helium ion implantation process, the high concentration region R11 and R12 has a higher (second) ion concentration ranges from about $5 \cdot 10^{16}$ atom/cm² to $8 \cdot 10^{16}$ atom/cm². In some embodiments, a ratio of the second (higher) ion concentration to the first (lower) ion concentration ranges substantially from 1.5~8.

Figure 6:
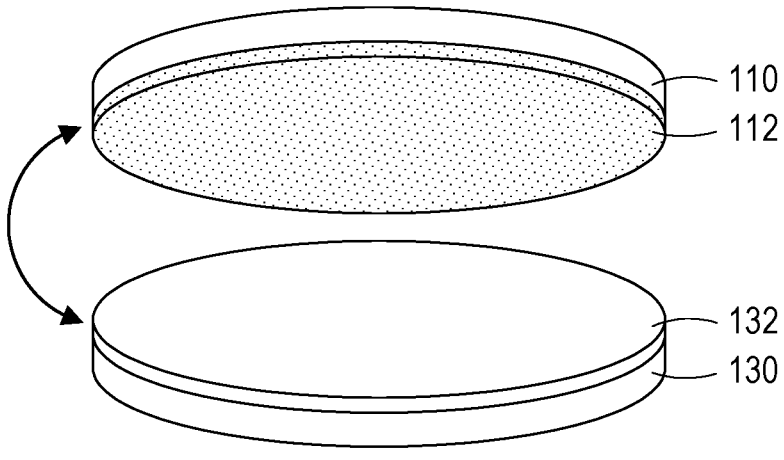
Figure 7:
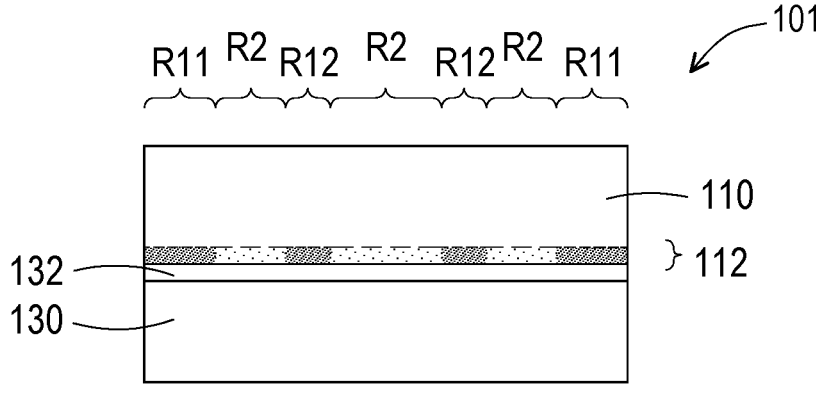

With reference to FIG. 6 and FIG. 7, at step S160, the semiconductor donor substrate 110 is bonded to a semiconductor handle substrate 130, so that the exfoliation layer 112 with the high concentration regions R11 and R12 is bonded to the semiconductor handle substrate 130. A suitable bonding process may include a hydrophilic bonding process, or the like. In the hydrophilic bonding process, appropriate surface cleaning of the semiconductor handle substrate 130 (and the exfoliation layer 112 if not done already) may be carried out. Thereafter, the bonded structure 101 are brought into direct or indirect contact to achieve the arrangement schematically illustrated in FIG. 7.

In some embodiments, the semiconductor handle substrate 130 and the semiconductor donor substrate 110 may be single crystal semiconductor wafers. In one embodiment, the semiconductor wafers includes a semiconductor material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the semiconductor handle substrate 130 and the semiconductor donor substrate 110, of the present embodiment typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. The disclosure is not limited thereto.

In some embodiments, the semiconductor handle substrate 130 includes an insulating layer 132, which may be made of any electrically insulating material suitable for use in a SOI structure, such as a material including $SiO_2$, $Si_3N_4$, aluminum oxide, or magnesium oxide. In some embodiments, the insulating layer 132 is a $SiO_2$ layer, i.e., the insulating layer 132 consists essentially of $SiO_2$, which contains dielectric layers may suitably be more readily etched relative to other materials which may form the dielectric layer. In some embodiments, the insulating layer 132 may be typically less than about 500 nm thick and, in certain embodiments, is less than about 300 nm thick, less than 200 nm thick, less than about 150 nm thick, or less than about 10 nm thick.

In some embodiments, the semiconductor donor substrate 110 and the semiconductor handle substrate 130 are bonded together by exposing the surfaces of the semiconductor donor substrate 110 and the semiconductor handle substrate 130 to a plasma, which modifies the structure of the surfaces in a process often referred to as surface activation. The semiconductor donor substrate 110 and the semiconductor handle substrate 130 are then pressed together and a bond is formed therebetween. This bond is typically relatively weak, and may therefore be strengthened prior to cleaving the structure to remove a portion of the semiconductor donor substrate 110.

Figure 8:
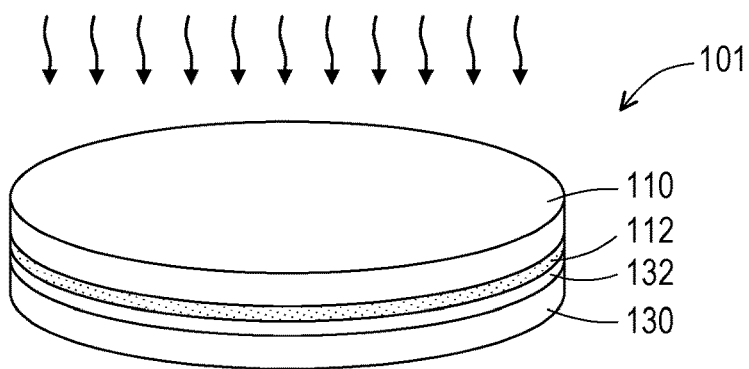
Figure 9:
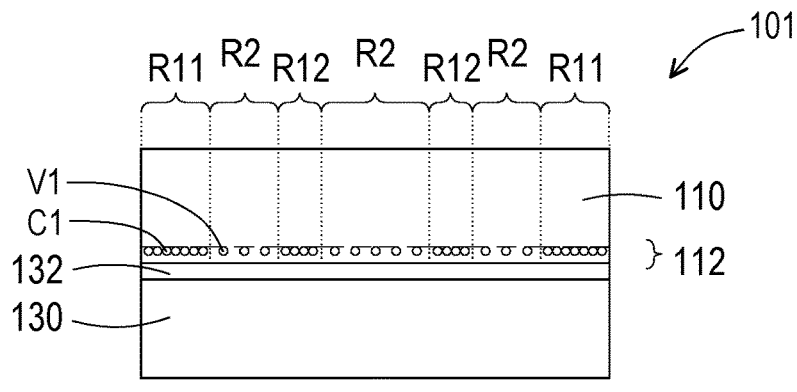
Figure 9A:
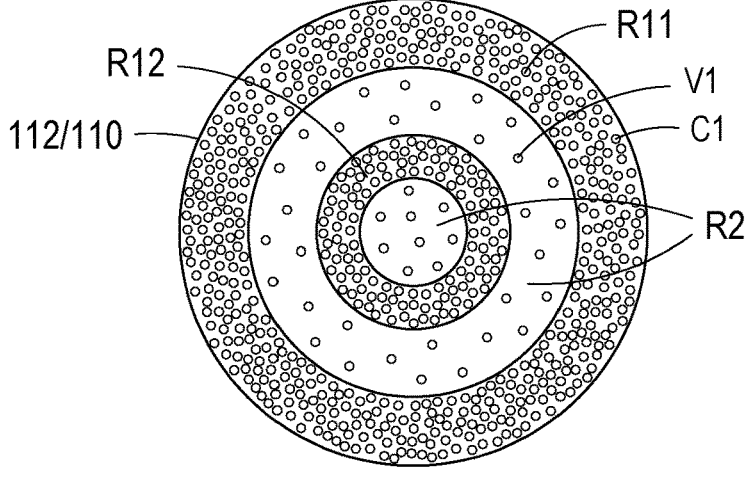
Figure 10:
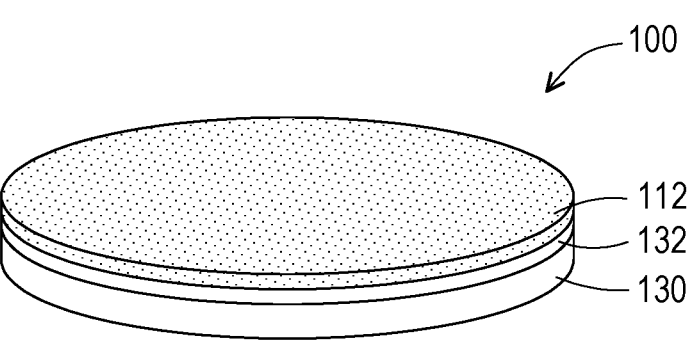
Figure 11:
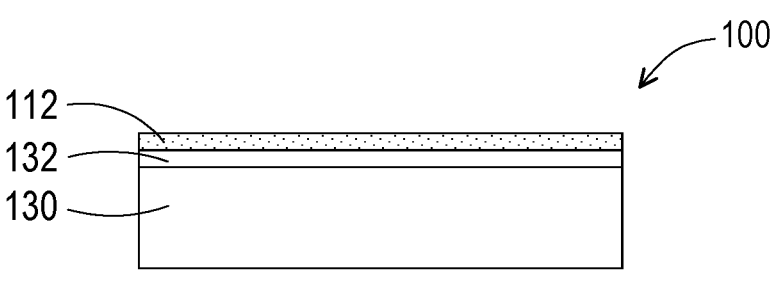

Referring to FIG. 8 to FIG. 9A, in some embodiments, at step S170, an annealing process is performed to separate the exfoliation layer 112 from the rest of the semiconductor donor substrate 110. In detail, the bond between the semiconductor donor substrate 110 and the semiconductor handle substrate 130 can be strengthened by annealing the bonded structure 101 to form covalent bonds between the adjoining surfaces of the semiconductor donor substrate 110 and the semiconductor handle substrate 130, thus solidifying the bond between the semiconductor donor substrate 110 and the semiconductor handle substrate 130. Concurrently with the annealing process of the bonded structure 101, the particles earlier implanted in the semiconductor donor substrate 110 weaken the cleave plane. In other words, the semiconductor donor substrate 110 having an ion implant region therein formed by helium ion and/or hydrogen ion implant is annealed at a temperature sufficient to form a thermally activated cleave plane in the semiconductor donor substrate 110. A portion of the semiconductor donor substrate 110 is then separated (i.e., cleaved) along the cleave plane (depicted as dotted line in FIG. 7) from the bonded structure 101 to form the SOI structure 100 shown in FIG. 11. An example of a suitable annealing apparatus might be a furnace, or the like.

Figure 16:
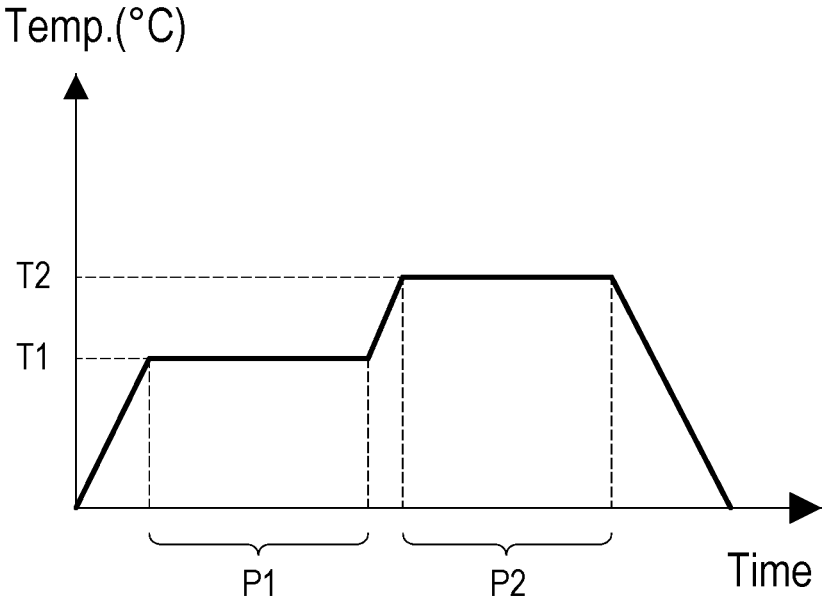
FIG. 16 illustrates a process temperature versus time diagram of an annealing process according to some exemplary embodiments of the present disclosure.

FIG. 16 illustrates a process temperature versus time diagram of an annealing process according to some exemplary embodiments of the present disclosure. Referring to FIG. 8 and FIG. 16, in some embodiments, the annealing process may include multiple stages. In one embodiment, the annealing process includes a first annealing process of heating the semiconductor donor substrate 110 up to a first heating temperature T1 for a first period of time P1, and a second annealing process of heating the semiconductor donor substrate 110 up to a second heating temperature T2 for a second period of time P2, wherein the second heating temperature T2 is higher than the first heating temperature T1, and the second period of time P2 is longer than the first period of time P1. For example, the first period of time P1 is substantially 1 hour, and the second period of time P2 is substantially 4 hour. For the embodiment of the semiconductor donor substrate 110 being a silicon substrate, the first heating temperature T1 ranges from about 200° C. to about 300° C., and the second heating temperature T2 ranges from about 400° C. to about 500° C. To be more specifically, in one embodiment, the first heating temperature T1 is about 250° C., and the second heating temperature T2 is about 450° C. That is, for the embodiment of the semiconductor donor substrate 110 being a silicon substrate, the bonded structure 101 is heated up to about 250° C. for about 1 hour and then heated up to about 450° C. for about 4 hour.

For the embodiment of the semiconductor donor substrate 110 being a lithium niobate (LiNbO3) substrate, the first heating temperature T1 ranges from about 90° C. to about 150° C., and the second heating temperature T2 ranges from about 220° C. to about 280° C. To be more specifically, in one embodiment, the first heating temperature T1 is about 120° C., and the second heating temperature T2 is about 250° C. That is, for the embodiment of the semiconductor donor substrate 110 being the LiNbO3 substrate, the bonded structure 101 is heated up to about 120° C. for about 1 hour and then heated up to about 250° C. for about 4 hour. Thermal annealing within these temperatures ranges and duration of times is sufficient to form a thermally activated cleave plane. After the thermal anneal to activate the cleave plane, the bonded structure 101 may be cleaved.

Referring to FIG. 9 and FIG. 9A, during the first annealing stage, the low concentration regions R2 generates voids V1, and voids in the high concentration regions R11 and R12 starts to merged and generate cracks C1. That is, cracks C1 generate at the perimeter region R11 and the inner region R12 of the exfoliation layer 112. Then, during the second annealing stage, the low concentration region R2 also starts to crack, and the cracks would propagate and extend through the perimeter region R11 to the inner region R12, so as to form a relatively horizontal cleave plane. Referring back to FIG. 3A, in some embodiments, a gap D1 between the outermost groove pattern 122 and the inner groove pattern 124 of the patterned mask layer 120 ranges from about 100 μm to about 10 mm, so the gap between the perimeter region R11 and the inner region R12 formed through the patterned mask layer 120 correspondingly ranges from about 100 μm to about 10 mm. If the gap between the perimeter region R11 and the inner region R12 is greater than 10 mm, the cracks C1 may not be propagate from the perimeter region R11 to the inner region R12 as desired.

After the multiple stages of thermal annealing processes, the bond between the semiconductor donor substrate 110 and the semiconductor handle substrate 130 is strong enough to initiate layer transfer via cleaving the bonded structure 101 at the cleave plane. Cleaving removes a portion of the semiconductor donor substrate 110, thereby leaving exfoliation layer 112 (e.g., a semiconductor device layer, preferably a silicon device layer) on the semiconductor-on-insulator structure 100. Accordingly, the exfoliation layer 112 can be separated (i.e., cleaved) along the evenly distributed horizontal cleave plane (depicted as dotted line in FIG. 7) from the rest of the semiconductor donor substrate 110 to form the SOI structure 100 shown in FIG. 10. Therefore, with multiple stages of implantation processes and multiple stages of annealing processes for forming the exfoliation layer 112 with different ion concentration, the direction of the cracks for forming the cleave plane can be well controlled, so the exfoliation layer 112 of the SOI structure 100 can be formed evenly.

It is noted that the dosage and anneal are such that the bond is strengthened and the cleave plane weakened without thermal cleavage occurring and the structure is mechanically cleaved in a subsequent or concurrent step. Like the thermal cleaving processes referred to above, layer transfer processes utilizing a mechanical cleave to separate the structure after implantation and bonding are generally known to the skilled person and may be utilized to implant, bond and separate the structure without departing from the scope of the present disclosure.

For example, the bonded structure 101 may be firstly placed in a fixture in which mechanical force is applied generally perpendicular to the opposing sides of the bonded structure 101 in order to pull a portion (e.g., the portion other than the exfoliation layer 112) of the semiconductor donor substrate 110 apart from the bonded structure 101. It should be noted that the opposing forces need not be perfectly perpendicular to the opposing sides without departing from the scope of the present disclosure. According to some embodiments, suction cups are utilized to apply the mechanical force. The separation of the exfoliation layer 112 of the semiconductor donor substrate 110 is initiated by applying a mechanical wedge at the perimeter region R11 of the semiconductor donor substrate 110 at the cleave plane in order to initiate propagation of a crack along the cleave plane. The mechanical force applied by the suction cups then pulls the portion of the semiconductor donor substrate 110 from the bonded structure 101, thus forming the SOI structure 100 shown in FIG. 10 and FIG. 11. According to other methods, the bonded structure 101 may instead be subjected to an elevated temperature over a period of time to separate the portion of the semiconductor donor substrate 110 from the bonded structure 101. Exposure to the elevated temperature causes initiation and propagation of a crack along the cleave plane, thus separating a portion of the semiconductor donor substrate 110.

Accordingly, the resulting SOI structure 100 includes a thin layer of semiconductor layer (i.e., the exfoliation layer 112 of the semiconductor donor substrate 110 remaining after cleaving) disposed over the insulating layer 132 and the semiconductor handle substrate 130. The cleaved surface of the SOI structure (i.e., the thin layer of silicon of the semiconductor donor substrate 110) has a rough surface that may be smoothed by additional processing. In some embodiments, a planarization process may be performed over an upper surface (the cleaved surface) of the exfoliation layer 112 after the exfoliation layer 112 is separated from the rest of the semiconductor donor substrate 110. The planarization process may include chemical mechanical polishing (or planarization) (CMP), or the like.

In some embodiments of the present disclosure, the SOI structure 100 has a semiconductor layer 112 with a thickness of from about 100 Å to about 5,000 Å, preferably from about 1,000 Å to about 2,000 Å. It should be understood, however, that other thicknesses may be used without departing from the scope of the present disclosure. Optionally, the semiconductor layer may contain materials other than silicon such as carbon, LiNbO3, germanium, or the like.

In accordance with the present disclosure, the SOI structure 100 formed by the layer transfer process may further be subjected to a high temperature anneal in order to reduce the surface roughness of the exfoliation layer 112 (e.g., transferred semiconductor device layer), densify the insulating layer 132, further strengthen the bond between the exfoliation layer 112 and the insulating layer 132 of the semiconductor handle substrate 130. An example of a suitable tool might be a vertical furnace. In some preferred embodiments, the SOI structure 100 is annealed at a temperature of from about 1000° C. to about 1200° C. Thermal annealing may occur for a duration of from about 0.5 hours to about 8 hours, preferably a duration of about 4 hours. After the cleaving process and the high temperature annealing process, the SOI structure 100 may be subjected to a cleaning process designed to remove thin thermal oxide and clean particulates from the surface.

Figure 12:
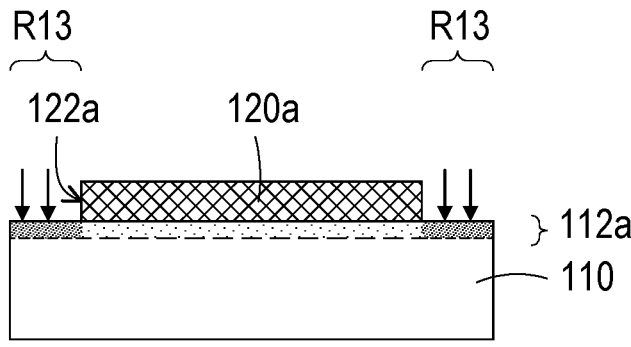
FIG. 12 to FIG. 14 illustrate schematic views of intermediate stages in the manufacturing of a semiconductor-on-insulator structure according to some exemplary embodiments of the present disclosure.
Figure 12A:
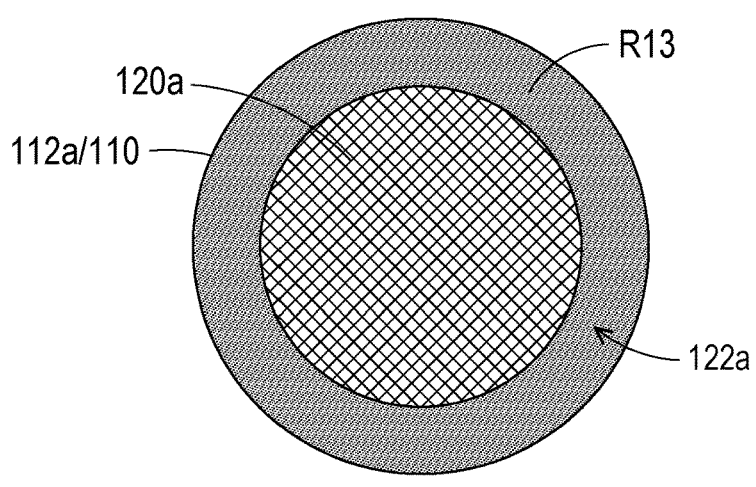
Figure 13:
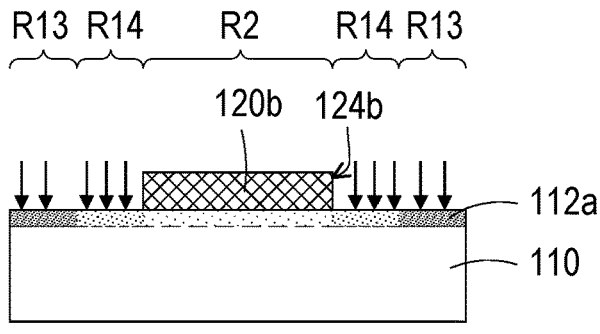
Figure 13A:
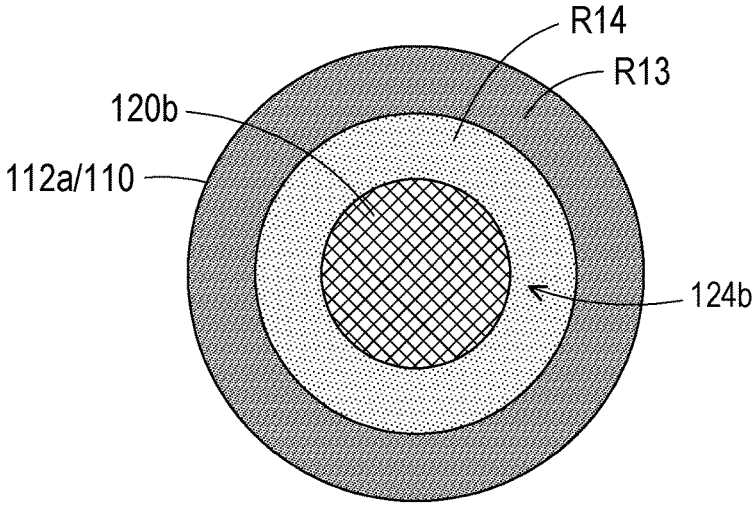
Figure 14:
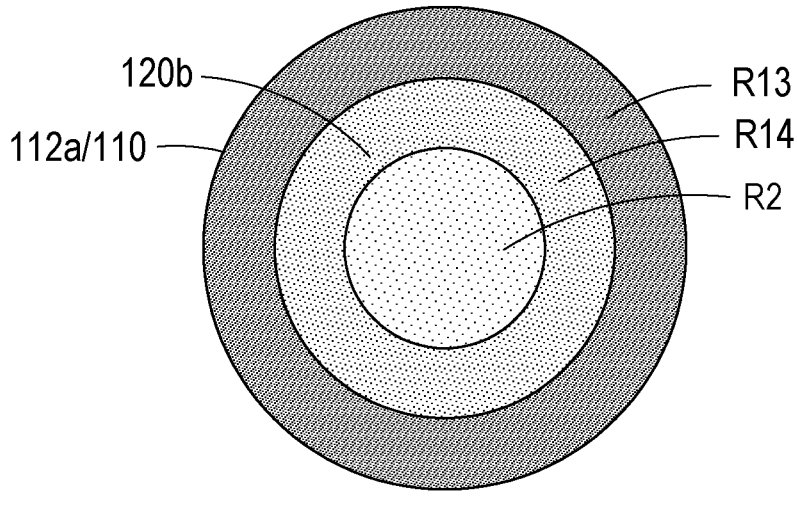

FIG. 12 to FIG. 14 illustrate schematic views of intermediate stages in the manufacturing of a semiconductor-on-insulator structure according to some exemplary embodiments of the present disclosure. In some embodiments, more than two implantation processes may be adopted in order to form a semiconductor donor substrate 110 with gradient ion concentration. For example, referring to FIG. 12, after the step S120 of performing the first implantation process illustrate in FIG. 2, a first patterned mask layer 120a is provided over the exfoliation layer 112a of the semiconductor donor substrate 110, and the first patterned mask layer 120a reveals the perimeter region R13 of the exfoliation layer 112a of the semiconductor donor substrate 110. In the present embodiment, the first patterned mask layer 120a has the outermost groove pattern 122a for exposing the perimeter region R13 of the exfoliation layer 112a without having the inner groove pattern. Then, a second implantation process is performed on the perimeter region R13 of the exfoliation layer 112a revealed by the outermost groove pattern 122 of the first patterned mask layer 120 to form a high concentration region R13 of the exfoliation layer 112a with a ion concentration higher than the ion concentration of the rest portion of the exfoliation layer 112a.

In the present embodiments, the first patterned mask layer 120 includes the outermost groove pattern 122 and the inner groove pattern 124, so the second implantation process is performed on the perimeter region R11 and the inner region R12 of the exfoliation layer 112 to form a high concentration region R11 and R12 with higher ion concentration, and the rest of the exfoliation layer 112 can be called as low concentration region R2 with lower ion concentration. The ion concentration of the high concentration region R11 and R12 is higher than the ion concentration of the rest of the exfoliation layer 112. The high concentration region R11 and R12 of the exfoliation layer 112 is created by subjecting the regions exposed by the patterned mask layer 120 to more than one ion implantation processes to create a weakened region below the upper surface of the donor semiconductor wafer 110.

Then, referring to FIG. 13 to FIG. 14, a second patterned mask layer 120*b* is provided over the semiconductor donor substrate 110 after the second implantation process is performed. The second patterned mask layer 120*b* reveals the perimeter region R13 and an inner region R14 of the exfoliation layer 112*a* where the inner region R14 is surrounded by the perimeter region R13. In some embodiments, the second patterned mask layer 120*b* with the groove pattern 124*b* can be a patterned mask layer newly formed over the semiconductor donor substrate 110. In other embodiments, the second patterned mask layer 120*b* may be patterned from the first patterned mask layer 120*a*. That is, the patterned mask layer 120*a* exposing the perimeter region R13 of the exfoliation layer 112*a* may be further exposed to a radiation and developed in a developer (a chemical solution) to further remove an inner region of the patterned mask layer 120*a* and form the second patterned mask layer 120*b* with the groove pattern 124*b* exposing the perimeter region R13 and the inner region R14 of the exfoliation layer 112*a* shown in FIG. 13.

Then, a third implantation process is performed on the perimeter region R13 and the inner region R14 of the exfoliation layer 112*a* revealed by the second patterned mask layer 120*b* to form a high concentration region (e.g., the perimeter region) R13 with highest ion concentration, a medium concentration region (e.g., the inner region) R14 with higher ion concentration and the rest of the exfoliation layer 112*a* can be called as low concentration region R2 with lower ion concentration. The high concentration region (e.g., the perimeter region) R13 of the exfoliation layer 112*a* is created by subjecting the regions exposed by the patterned mask layer 120*a* and 120*b* under 3 times of ion implantation processes to create a weakest region below the upper surface of the donor semiconductor wafer 110. The medium concentration region (e.g., the inner region) R14 of the exfoliation layer 112*a* is created by subjecting the regions exposed by the patterned mask layer 120*b* under 2 times of ion implantation processes to create a weaker region below the upper surface of the donor semiconductor wafer 110. The low concentration region (e.g., the rest portion) R2 of the exfoliation layer 112*a* is created by subjecting the regions exposed by the patterned mask layer 120*b* under 1 times of ion implantation processes to create a mildly weakened region below the upper surface of the donor semiconductor wafer 110. Accordingly, when the semiconductor donor substrate 110 is separated (i.e., cleaved) along the cleave plane (depicted as dotted line in FIG. 13) to form the SOI structure, the cracks would generate from the perimeter region of the exfoliation layer 112*a* and propagate toward the center of the exfoliation layer 112*a* to form a relatively horizontal cleave plane. As such, the direction of the cracks for forming the cleave plane can be well controlled, so the exfoliation layer 112*a* on the SOI structure can be formed evenly.

Figure 15:
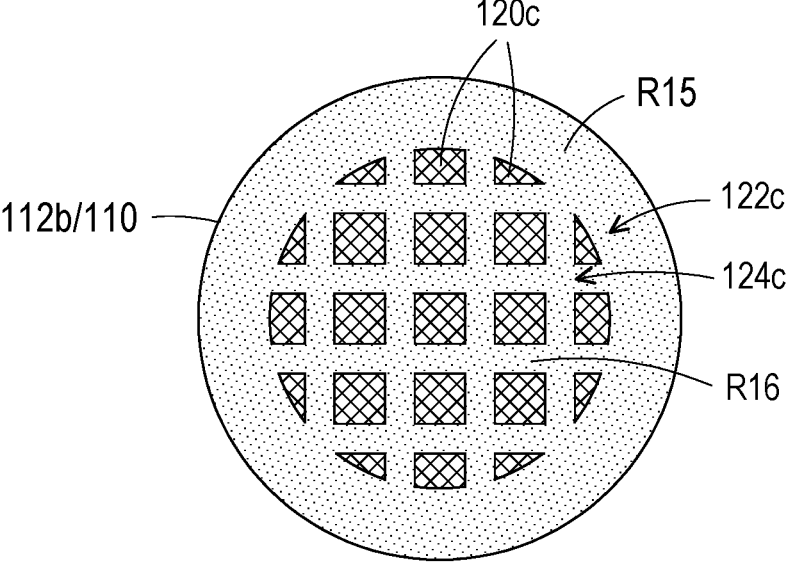
FIG. 15 illustrates a top view of an intermediate stage in the manufacturing of a semiconductor-on-insulator structure according to some exemplary embodiments of the present disclosure.

FIG. 15 illustrates a top view of an intermediate stage in the manufacturing of a semiconductor-on-insulator structure according to some exemplary embodiments of the present disclosure. Referring to FIG. 15, in some embodiments, the patterned mask layer 120*c* may include the outermost groove pattern 122*c* and an inner groove pattern 124*c*. The outermost groove pattern 122*c* reveals the perimeter region R15 of the exfoliation layer 112*b*, and the inner groove pattern 124*c* is arranged in grid manner as shown in FIG. 15.

The inner groove pattern 124*c* reveals an inner region R16 of the exfoliation layer 112*b* surrounded by the perimeter region R15. Accordingly, by performing a second implantation process through such patterned mask layer 120*c*, the regions (perimeter region R15 and the inner region R16 in grid manner) exposed by the patterned mask layer 120*c* are subjected to more than one ion implantation processes to create a weakened region with higher ion concentration below the upper surface of the donor semiconductor wafer 110. The rest of the exfoliation layer 112*b* that is covered by the patterned mask layer 120*c* during the second implantation process can be called as low concentration region R2 with lower ion concentration. Accordingly, when the semiconductor donor substrate 110 is separated (i.e., cleaved) along the cleave plane to form the SOI structure, the cracks would generate from the perimeter region R15 and the inner region R16 of the exfoliation layer 112*b* and propagate toward the rest the exfoliation layer 112*b* to form a relatively horizontal cleave plane. As such, the direction of the cracks for forming the cleave plane can be well controlled, so the exfoliation layer 112*b* on the SOI structure can be formed evenly. The disclosure merely illustrates some of the possible patterns of the patterned mask layer used for implantation process. One of ordinary skills in the art should understand that other patterned mask layer with different inner groove patterns may also be adopted as long as at least the perimeter region of the exfoliation layer is exposed by the patterned mask layer to be subjected to multiple implantation processes.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a method of implanting a semiconductor donor substrate includes the following steps. A semiconductor donor substrate is provided. A first implantation process is performed to form an exfoliation layer of the semiconductor donor substrate with a first ion concentration. A first patterned mask layer is performed over the exfoliation layer of the semiconductor donor substrate, wherein the first patterned mask layer at least reveals a perimeter region of the exfoliation layer of the semiconductor donor substrate. A second implantation process is performed on the perimeter region of the exfoliation layer revealed by the first patterned mask layer to form a high concentration region of the exfoliation layer with a second ion concentration higher than the first ion concentration. The first patterned mask layer is removed. In one embodiment, the first patterned mask layer comprises an outermost groove pattern surrounding a perimeter of the exfoliation layer to reveal the perimeter region of the exfoliation layer. In one embodiment, the first patterned mask layer comprises an inner groove pattern within a region surrounded by the outermost groove pattern to reveal an inner region of the exfoliation layer. In one embodiment, a gap between the outermost groove pattern and the inner groove pattern ranges substantially from 100 µm to 10 mm. In one embodiment, the inner groove pattern is arranged in concentric manner with respect to the outermost groove pattern. In one embodiment, the inner groove pattern is arranged in grid manner. In one embodiment, the method further includes: providing a second patterned mask layer over the semiconductor donor substrate after the second implantation process is performed, wherein the second patterned mask layer reveals the perimeter region of the exfoliation layer and an inner region of the exfoliation layer; and performing a third implantation process on the perimeter region and the inner region of the exfoliation layer revealed by the second patterned mask layer. In one embodiment, the first implantation process and the second implantation process comprises hydrogen ion implantation, the first ion concentration ranges substantially from $4 \cdot 10^{16}$ to $6 \cdot 10^{16}$, and the second ion concentration ranges substantially from $8 \cdot 10^{16}$ to $1 \cdot 10^{17}$. In one embodiment, the first implantation process and the second implantation process comprises helium ion implantation, the first ion concentration ranges substantially from $1 \cdot 10^{16}$ to $3 \cdot 10^{16}$, and the second ion concentration ranges substantially from $5 \cdot 10^{16}$ to $8 \cdot 10^{16}$. In one embodiment, a ratio of the second ion concentration to the first ion concentration ranges substantially from 1.5~8.

In accordance with some embodiments of the disclosure, a method of a semiconductor-on-insulator structure includes the following steps. A semiconductor donor substrate is provided. A first implantation process is performed to form an exfoliation layer of the semiconductor donor substrate with a first ion concentration. A second implantation process is performed on a perimeter region of the exfoliation layer to form a high concentration region of the exfoliation layer with a second ion concentration higher than the first ion concentration. The semiconductor donor substrate is bonded to a semiconductor handle substrate, so that the exfoliation layer with the high concentration region is bonded to the semiconductor handle substrate. An annealing process is performed to separate the exfoliation layer from the rest of the semiconductor donor substrate. In one embodiment, a ratio of the second ion concentration to the first ion concentration ranges substantially from 1.5~8. In one embodiment, the annealing process includes: heating the semiconductor donor substrate up to a first heating temperature for a first period of time; and heating the semiconductor donor substrate up to a second heating temperature higher than the first heating temperature for a second period of time longer than the first period of time. In one embodiment, the first period of time is substantially 1 hour, and the second period of time is substantially 4 hour. In one embodiment, the semiconductor donor substrate includes a silicon substrate, the first heating temperature ranges substantially from 200° C. to 300° C., and the second heating temperature ranges substantially from 400° C. to 500° C. In one embodiment, the semiconductor donor substrate comprises a lithium niobate substrate, the first heating temperature ranges substantially from 90° C. to 150° C., and the second heating temperature ranges substantially from 220° C. to 280° C. In one embodiment, the method further includes a planarization process performed over an upper surface of the exfoliation layer after the exfoliation layer is separated from the rest of the semiconductor donor substrate.

In accordance with some embodiments of the disclosure, a method of a semiconductor-on-insulator structure includes the following steps. A semiconductor donor substrate is provided. A first implantation process is performed to form an exfoliation layer of the semiconductor donor substrate. A second implantation process is performed on a perimeter region of the exfoliation layer to form a high concentration region of the exfoliation layer. The semiconductor donor substrate is bonded to a semiconductor handle substrate, so that the exfoliation layer with the high concentration region is bonded to the semiconductor handle substrate. A first annealing process is performed to heat up the semiconductor donor substrate to a first temperature. A second annealing process is performed to heat up the semiconductor donor substrate to a second temperature higher than the first temperature to separate the exfoliation layer from the rest of the semiconductor donor substrate. In one embodiment, the second implantation process is performed on the perimeter region and an inner region of the exfoliation layer, and the inner region is surrounded by the perimeter region. In one embodiment, an ion concentration of the high concentration region is higher than an ion concentration of the rest of the exfoliation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of implanting a semiconductor donor substrate, comprising:

providing a semiconductor donor substrate;

performing a first implantation process to form an exfoliation layer of the semiconductor donor substrate with a first ion concentration;

providing a first patterned mask layer over the exfoliation layer of the semiconductor donor substrate, wherein the first patterned mask layer at least reveals a perimeter region of the exfoliation layer of the semiconductor donor substrate;

performing a second implantation process on the perimeter region of the exfoliation layer revealed by the first patterned mask layer to form a high concentration region of the exfoliation layer with a second ion concentration higher than the first ion concentration;

removing the first patterned mask layer;

providing a second patterned mask layer over the semiconductor donor substrate after the second implantation process is performed, wherein the second patterned mask layer reveals the perimeter region of the exfoliation layer and an inner region of the exfoliation layer; and performing a third implantation process on the perimeter region and the inner region of the exfoliation layer revealed by the second patterned mask layer.

2. The method as claimed in claim 1, wherein the first patterned mask layer comprises an outermost groove pattern surrounding a perimeter of the exfoliation layer to reveal the perimeter region of the exfoliation layer.

3. The method as claimed in claim 2, wherein the first patterned mask layer comprises an inner groove pattern within a region surrounded by the outermost groove pattern to reveal an inner region of the exfoliation layer.

4. The method as claimed in claim 3, wherein a gap between the outermost groove pattern and the inner groove pattern ranges substantially from 100 μm to 10 mm.

5. The method as claimed in claim 3, wherein the inner groove pattern is arranged in concentric manner with respect to the outermost groove pattern.

6. The method as claimed in claim 3, wherein the inner groove pattern is arranged in grid manner.

7. The method as claimed in claim 1, wherein the first implantation process and the second implantation process comprises hydrogen ion implantation, the first ion concentration ranges substantially from $4 \cdot 10^{16}$ to $6 \cdot 10^{16}$, and the second ion concentration ranges substantially from $8 \cdot 10^{16}$ to $1 \cdot 10^{17}$.

8. The method as claimed in claim 1, wherein the first implantation process and the second implantation process comprises helium ion implantation, the first ion concentration ranges substantially from $1 \cdot 10^{16}$ to $3 \cdot 10^{16}$, and the second ion concentration ranges substantially from $5 \cdot 10^{16}$ to $8 \cdot 10^{16}$.

9. The method as claimed in claim 1, wherein a ratio of the second ion concentration to the first ion concentration ranges substantially from 1.5~8.

10. A method of a semiconductor-on-insulator structure, comprising:

providing a semiconductor donor substrate;

performing a first implantation process to form an exfoliation layer of the semiconductor donor substrate with a first ion concentration;

performing a second implantation process on a perimeter region of the exfoliation layer to form a high concentration region of the exfoliation layer with a second ion concentration higher than the first ion concentration;

bonding the semiconductor donor substrate to a semiconductor handle substrate, so that the exfoliation layer with the high concentration region is bonded to the semiconductor handle substrate; and performing an annealing process to separate the exfoliation layer from the rest of the semiconductor donor substrate;

wherein the annealing process comprises:

heating the semiconductor donor substrate up to a first heating temperature for a first period of time; and heating the semiconductor donor substrate up to a second heating temperature higher than the first heating temperature for a second period of time longer than the first period of time;

wherein the semiconductor donor substrate comprises a lithium niobate substrate, the first heating temperature ranges substantially from 90° C. to 150° C., and the second heating temperature ranges substantially from 220° C. to 280° C.

11. The method as claimed in claim 10, wherein a ratio of the second ion concentration to the first ion concentration ranges substantially from 1.5~8.

12. The method as claimed in claim 10, wherein the first period of time is substantially 1 hour, and the second period of time is substantially 4 hour.

13. The method as claimed in claim 10, wherein the semiconductor donor substrate comprises a silicon substrate, the first heating temperature ranges substantially from 200° C. to 300° C., and the second heating temperature ranges substantially from 400° C. to 500° C.

14. The method as claimed in claim 10, further comprising a planarization process performed over an upper surface of the exfoliation layer after the exfoliation layer is separated from the rest of the semiconductor donor substrate.

15. A method of a semiconductor-on-insulator structure, comprising:

providing a semiconductor donor substrate;

performing a first implantation process to form an exfoliation layer of the semiconductor donor substrate;

performing a second implantation process on a perimeter region of the exfoliation layer to form a high concentration region of the exfoliation layer;

bonding the semiconductor donor substrate to a semiconductor handle substrate, so that the exfoliation layer with the high concentration region is bonded to the semiconductor handle substrate; and performing a first annealing process to heat up the semiconductor donor substrate to a first temperature; and performing a second annealing process to heat up the semiconductor donor substrate to a second temperature higher than the first temperature to separate the exfoliation layer from the rest of the semiconductor donor substrate;

wherein the second implantation process is performed on the perimeter region and an inner region of the exfoliation layer, and the inner region is surrounded by the perimeter region.

16. The method as claimed in claim 15, wherein an ion concentration of the high concentration region is higher than an ion concentration of the rest of the exfoliation layer.

\* \* \* \* \*